United States Patent
Ramanujan

(10) Patent No.: US 9,298,606 B2
(45) Date of Patent: Mar. 29, 2016

(54) STATISTICAL WEAR LEVELING FOR NON-VOLATILE SYSTEM MEMORY

(75) Inventor: Raj K. Ramanujan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 13/977,652

(22) PCT Filed: Sep. 30, 2011

(86) PCT No.: PCT/US2011/054384
§ 371 (c)(1),
(2), (4) Date: Jun. 28, 2013

(87) PCT Pub. No.: WO2013/048470
PCT Pub. Date: Apr. 4, 2013

(65) Prior Publication Data
US 2013/0282967 A1    Oct. 24, 2013

(51) Int. Cl.
| | |
|---|---|
| G06F 3/00 | (2006.01) |
| G06F 13/00 | (2006.01) |
| G06F 12/02 | (2006.01) |
| G11C 16/06 | (2006.01) |
| G06F 3/06 | (2006.01) |
| G11C 16/34 | (2006.01) |

(52) U.S. Cl.
CPC .......... *G06F 12/0246* (2013.01); *G06F 3/0689* (2013.01); *G11C 16/06* (2013.01); *G11C 16/3495* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 6,000,006 A | 12/1999 | Bruce et al. | |
| 7,441,067 B2 | 10/2008 | Gorobets et al. | |
| 8,612,804 B1* | 12/2013 | Kang et al. | 714/42 |
| 8,949,506 B2* | 2/2015 | Post et al. | 711/103 |
| 2007/0208904 A1 | 9/2007 | Hsieh et al. | |
| 2009/0089485 A1 | 4/2009 | Yeh | |

(Continued)

FOREIGN PATENT DOCUMENTS

| | | |
|---|---|---|
| CN | 1591685 | 3/2005 |
| CN | 101030166 | 9/2007 |

(Continued)

OTHER PUBLICATIONS

PCT Search Report, PCT/US2011/054384, Intel Corporation, May 29, 2012, 9 pages.

(Continued)

*Primary Examiner* — Idriss N Alrobaye
*Assistant Examiner* — Richard B Franklin
(74) *Attorney, Agent, or Firm* — Blakely, Sokoloff, Taylor & Zafman LLP

(57) ABSTRACT

Statistical wear leveling is described that may be particularly useful for non-volatile system memory. In one embodiment, the invention includes a wear level move state machine to select an active block based on a wear criteria, to move the contents of the selected active block to a block from a free block list, and to move the selected active block to an unused block list, a free block list expansion state machine to take a block from a target free block list, to move the contents of the block to a block from the unused block list, and to move the block taken from the target block list to a free block list, and a target free block generation state machine to select blocks from the unused block list and to move the selected blocks to the target free block list.

22 Claims, 6 Drawing Sheets

(56) References Cited

U.S. PATENT DOCUMENTS

| | | |
|---|---|---|
| 2010/0037006 A1 | 2/2010 | Chen et al. |
| 2011/0131367 A1 | 6/2011 | Park et al. |
| 2011/0231600 A1 | 9/2011 | Tanaka et al. |

FOREIGN PATENT DOCUMENTS

| | | |
|---|---|---|
| TW | I303828 | 12/2008 |
| TW | 2009-15324 | 4/2009 |
| TW | I316207 | 10/2009 |

OTHER PUBLICATIONS

European Search Report for EP Counterpart Application No. 11873322.9, 7 pgs., (Apr. 29, 2015).

European Search Report for EP Counterpart Application No. 101130835, 2 pgs., (May 19, 2015).

Chinese Search Report for CN Counterpart Application No. 201180075090.5, 2 pgs., (Nov. 17, 2015).

* cited by examiner

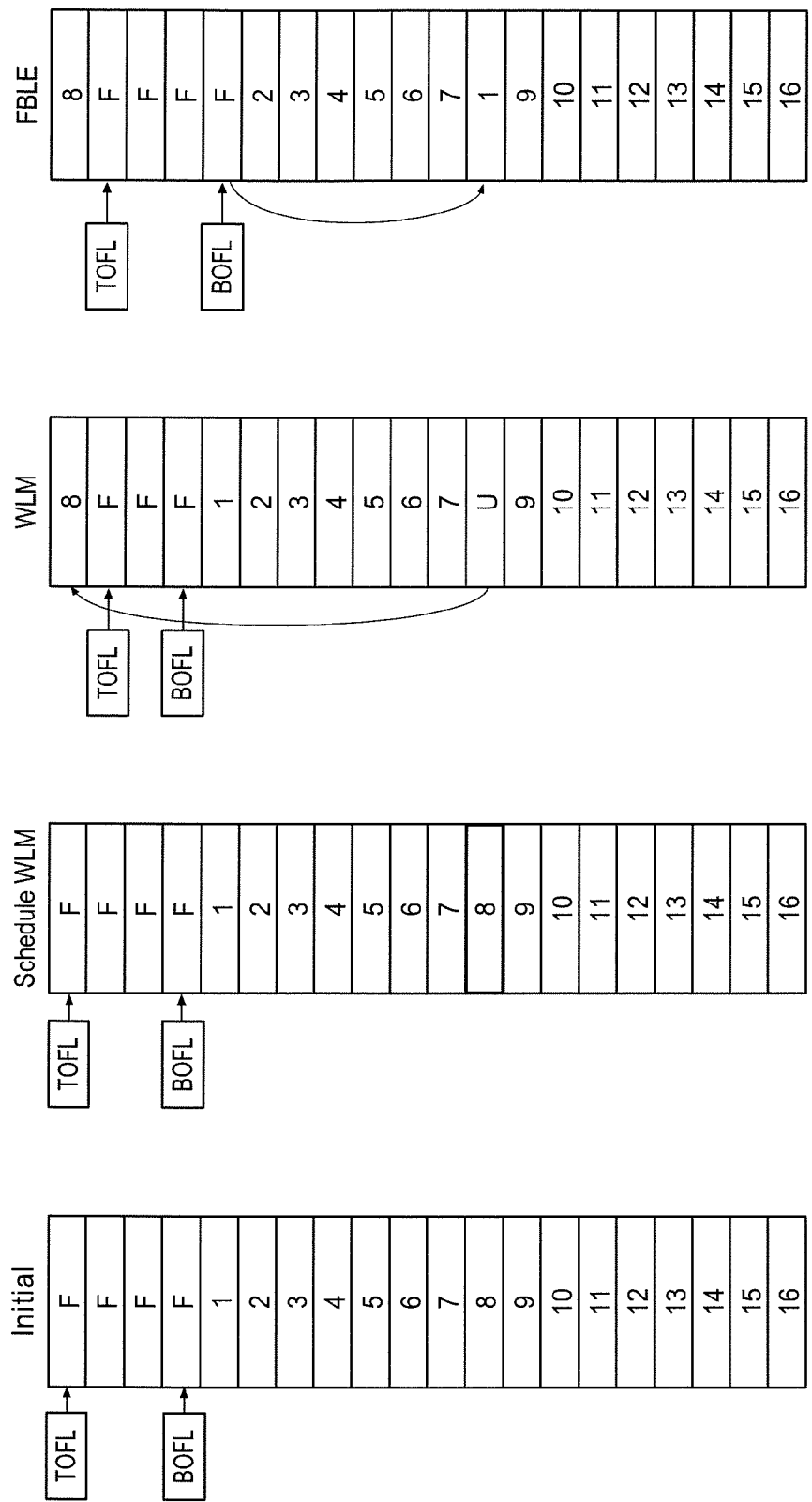

US 9,298,606 B2

STATISTICAL WEAR LEVELING FOR NON-VOLATILE SYSTEM MEMORY

FIELD

The present disclosure relates to the field of wear leveling for memory arrays, and in particular, to wear leveling the use of memory cell blocks using block lists and move operations.

BACKGROUND

A variety of different new memory cell technologies have been developed and are being developed as replacements for magnetic and switched transistor memories, such as hard disk drives, and random access memory of various kinds. Some of these new memory types have limitations on the number of write cycles they allow to any particular memory cell. In order to maximize the service life of these memory devices, a wear-leveling system is used to level the wear across the memory cells distributing writes through-out the device. The wear leveling may be in an operating system, a software application, a memory controller, or a memory module.

PCM (Phase Change Memory) and PCMS (Phase Change Memory and Switch) are NVM (Non-Volatile Memory) technologies with performance characteristics suitable for use as a memory in a variety of different computing systems. PCMS provides fast reads and writes and can allow a single memory cell or a small group of cells to be written at one time. This makes PCMS suitable not just for replacing conventional mass storage memory but also short term and buffer memory. Currently DRAM (Dynamic Random Access Memory) and SRAM (Static Random Access Memory) are used for these high speed applications. However, like NAND and other types of flash memory, PCMS has a limit to the total number of write cycles that can be performed to any one storage cell.

Traditional wear-leveling schemes applied to NAND create problems when applied to a typical main memory application. Main memory is accessed frequently using small granularity reads and writes and even small latency increases have a significant performance impact on the overall system. Traditional wear-leveling schemes for NAND use large blocks of memory cells for wear leveling and require considerable overhead in processing the wear leveling operations. Such schemes also require a large quantity of metadata to track the used of each cell block. Such schemes therefore become expensive for main memory applications.

With NAND based storage sub-systems very large wear leveling blocks are used together with explicit wear-leveling. Explicit wear leveling requires keeping track of the total write-count to every NAND block. If the NAND based storage is used as a mass storage system, such as for a hard disk drive replacement, then the performance requirements are significantly lower than for main memory. However, such large wear-level blocks are not usable with memory sub-systems that are particularly sensitive to latency. This might include graphics and processing buffers and short term cache memory subsystems. In addition, since the write traffic in a main memory or similar application typically consists of many small granularity writes that are randomly distributed, it is very difficult to track these writes using large memory cell blocks. Finally, explicit wear-leveling requires that the total wear-count be maintained and updated on each write. This becomes very complex for smaller blocks in a memory application. In order to explicitly track the writes for each cell most existing NAND memory systems use an intelligent micro-controller and firmware for wear leveling.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 4A-4D are block diagrams of memory blocks of an array showing the movement of data and addresses among the blocks for wear leveling according to an embodiment of the invention.

DETAILED DESCRIPTION

Figure 1:
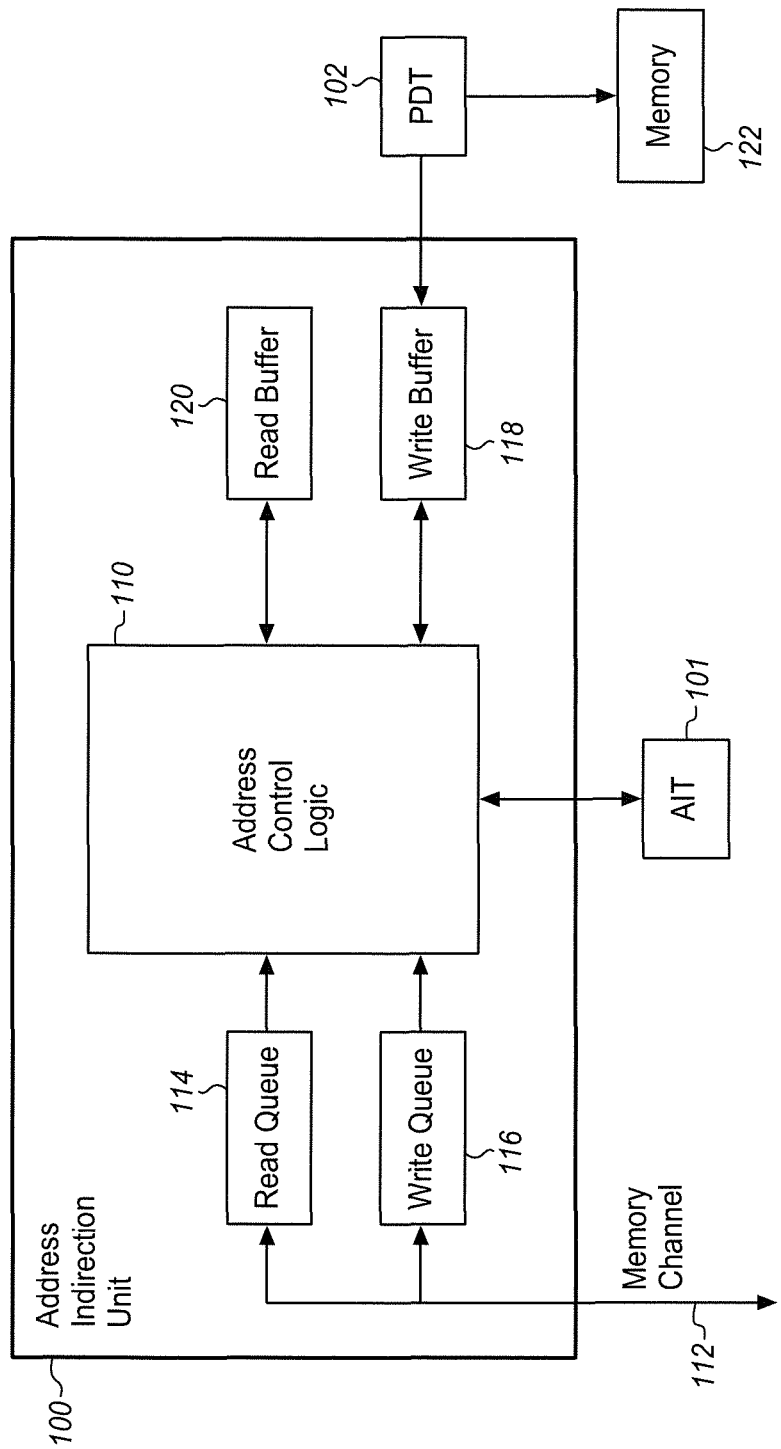
FIG. 1 is a block diagram of a memory address indirection system according to an embodiment of the invention.

According to one embodiment, the present invention uses a statistical wear leveling mechanism that is fast and has very low overhead. It works in the presence of small granularity write operations and still maximizes the service life of the connected memory array.

The described wear-leveling scheme is particularly useful for use in high performance applications with small write granularity, but is not so limited. The scheme enables small granularity writes directly to a PCMS array for highest performance and bandwidth efficiency. Wear leveling with smaller block granularity, such as a 4 KB block is allowed. The wear level frequency can be modulated using a fixed write cycle count trigger that trades-off the uniformity of wear-leveling with the bandwidth cost. Hot spots can be avoided by using the entire PCMS address space for uniform wear-level moves. Workload behavior can be decoupled from the selection of a block for a wear-leveling move. Malicious or abusive software can be protected against. An overall wear count can be maintained for each block to help with "wear band" classification requirements. Finally ECC (Error Correction Code) or error detection codes can be used to identify blocks that are reaching the end of the wear-out life. These blocks can be treated as bad blocks and removed from use.

One or more of these and other advantages can be obtained using one or more of the features that are described in more detail below. These features include a high speed address indirection mechanism, and a periodic trigger based on write frequency to perform a wear-level move. In addition the scheme has an ability to allow small granularity writes into a PCMS system while being able to wear level at a larger block granularity. The automatic exclusion of bad blocks can be comprehended and a periodic trigger can be combined with random selection of free wear level blocks to ensure some statistical uniformity to the wear leveling.

The wear-leveling scheme described herein in one embodiment divides up the System Physical Address space (SPA)

that software uses to address memory into blocks of 4 KB size. The PCMS Device Address space (PDA) is also divided up in the same size blocks. Each SPA block is mapped to a specific PDA block. Writes into this block are counted and tracked. At a predetermined count, the SPA Block is moved to a different PDA block selected using a variety of different algorithms that ensures randomization with respect to the software write pattern. SPA Blocks are continuously remapped to different PDA blocks depending on the frequency of writes. The remapping scheme ensures that the entire PDA space is covered without creating any software generated hot spots.

Due to the statistical nature of the remapping, there is no need to track the total number of writes into any block. The algorithm ensures uniform wear within a narrow window dictated by the number of writes after which a block will be moved.

Since writes into any wear-level block happen using a smaller granularity than a single block (sub-block), the write count does not distinguish between writes to different sub-blocks. It is possible to create hot-spots within a block if software chooses to write to the same sub-blocks of a single block repeatedly. An additional mechanism ensures that no hotspots are created within one block. On every Wear-Leveling move of an SPA block to a different PDA block, all the 64 B sub-blocks within the 4 KB block can be randomly shuffled to ensure that any one part of the 4 KB block does not wear out.

In one embodiment, the shuffle is initiated using a predetermined seed and a key. This key can be tracked for each block in the AIT. The next time the SPA sub-block is accessed; this same seed and key are used to regenerate the 64 B address within the PDA block. In another embodiment, the target blocks can be selected using a walk through the physical addresses, a patterned walk, or a random walk can be used. The target blocks can also be selected based on a list generated during startup. Additional alternatives include a random shuffle using a static seed, sequential rotation, applying an XOR to address bits with a random number, applying an XOR to PDA address bits with SPA address bits, etc.

FIG. 1 shows a block diagram of a memory address indirection system that may include a wear leveling system as described in more detail below. The address indirection unit 100 sends and receives memory address, command, and data over through a memory channel 112 that is coupled to a memory controller, a general purpose controller, or a processor, depending on the particular implementation. The read commands and data are received into a read queue 114 and the write commands and data are received into a write queue 116. Reads and writes are both sent to an address control unit 110 that interprets the memory channel addresses and applies them to physical addresses of a physical memory cell array 122.

The address control unit is further coupled to a write buffer 118 and a read buffer 120 to buffer reads and writes after they have been translated in the address control unit for application to the memory 122.

FIG. 1 shows two of the data structures that may be used by the address control unit in one embodiment of the invention. An Address Indirection Table (AIT) 101 stores the current map of address translation from System Physical Address (SPA) space, used by the memory channel 112, to PCMS Device Address Space (PDA), used by the memory 122. It also holds the number of writes into each block of address space since the most recent wear leveling move. The AIT is kept in some type of fast memory such as DRAM for quick access. It may be accessed with each read and write transaction.

The AIT is frequently modified by the wear leveling processes described below. The security of the system and the leveling of the wear can be enhanced further by randomizing the mapping of the AIT when it is initially configured. In the event that the PCMS memory is erased or substantially erased, the AIT can also be randomized again for the erased blocks. This not only levels the wear, but eliminates any ability for outsiders to predict which PDA corresponds to any particular SPA. In addition, while the AIT maps blocks of memory cells from a SPA for that block to a PDA for that block, the wear may be further leveled by randomizing the ordering of sub-blocks of the PDA within each block.

In one embodiment, the AIT is organized as a simple linear table of translation entries. Each entry maps, for example, a 4 KB PCMS page. Each entry in the AIT may be only a few bytes. Therefore the size of the AIT is kept small. While the AIT may be maintained in the PCMS, it may then also require wear leveling which renders the system more complex. In one embodiment, the AIT is located in a separate DRAM chip easily accessible by and separate from the memory controller chip.

The off-die AIT may be augmented with an AIT cache (see FIG. 2) stored locally in the memory controller. The cache may be used for the most recently accessed AIT entries such that future accesses into the blocks covered by these entries will not require an off-die AIT access. Since software often accesses the same location multiple times in short succession, the cache may provide for faster memory access times. On the other hand, the cache adds complexity in that it must be kept up to date and any address not in the cache will be accessed more slowly.

FIG. 1 also shows a PCMS Descriptor Table (PDT) 102 between the read and write buffers and the physical memory. The PCMS Descriptor Table is a reverse AIT. It stores the same map in reverse to translate the addresses of each PDA block to addresses of the corresponding SPA block. In addition it can also be used to hold a type for each block. This can include a record as to which blocks are bad blocks. The PDT can be used to pick blocks in PDA space for the destination of wear-level moves. Such blocks are called "Free Blocks" and kept in a Free Block List in the memory controller. Since a block selected to be a Free Block can contain valid data, this must first be moved to some unused block prior to moving it to the Free Block List. The AIT is appropriately modified to change the SPA to PDA map for the original block that was moved. The PDT is maintained in persistent memory and typically will reside in the PCMS memory itself.

Figure 2:
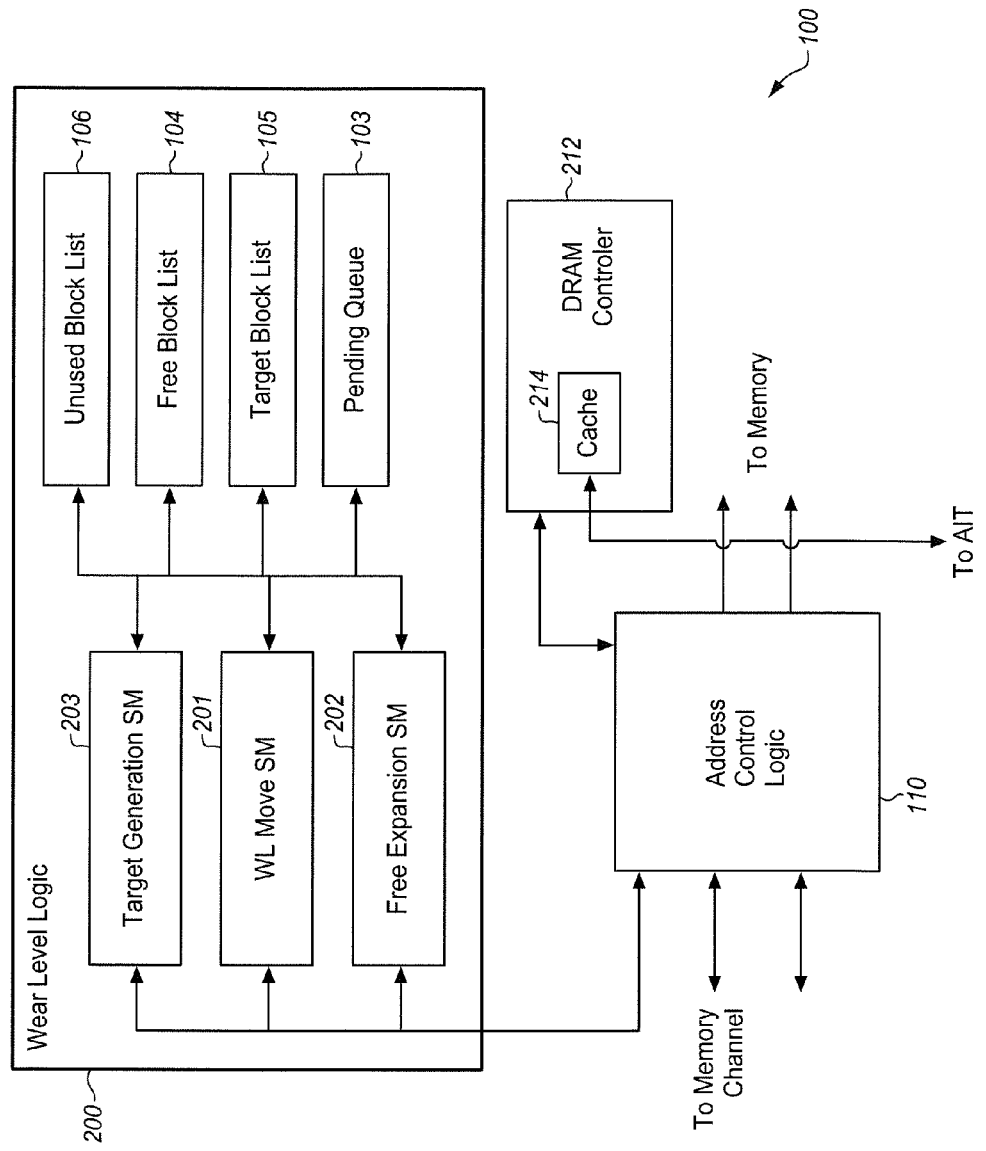
FIG. 2 is a block diagram of the Address Indirection Unit of FIG. 1 according to an embodiment of the invention.

FIG. 2 shows the Address Indirection Unit 100 of FIG. 1 in more detail. In particular, FIG. 2 shows detail of Wear Level Logic 200 within the Address Indirection Unit 100. The wear level logic is shown as a set of queues or lists that interact with state machines. The wear level logic may be implemented as hardware components as illustrated or as software modules, as firmware or as a combination of different such items.

Block 103 is a Pending Wear Level Queue (PWLQ) within the Wear Level Logic 200. This queue holds a descriptor of each SPA block to indicate each block's level of wear. This can be used to determine when a block should be moved for wear leveling purposes. This queue as with most of the other data structures and state machines described below may be maintained inside the memory controller or in some other quickly accessible location. In one embodiment, an entry is made to the bottom of the queue when a write request through the AIT find that the write count value in the AIT entry for that block is greater than or equal to the values for a write count low threshold and less than or equal to a write count-high threshold.

As mentioned above, the AIT maintains a write count register for each block. The value may be an actual count of write operations or some other value that is related to the number of writes. In one embodiment the write count is a factor of the actual write count, such as one-sixteenth or some other convenient value. To spread wear leveling operations more evenly in time, the write counts can be initialized to random values. This will also begin the wear leveling process sooner so that the Pending Queue does not remain empty for some amount of time and then very quickly fill as several blocks reach the write count threshold around the same time. In addition, it is not necessary to track a total write count for each physical block of memory. As described below, the various block lists are able to statistically distribute the use of the blocks without knowledge of total write counts. Accordingly, when a block is moved back into use a new write count can be initialized either at zero or at some other random or predetermined value.

Block 104 is a Free Wear Level Block List (FWLBL) in the wear level logic. This list contains descriptors of the PDA blocks that are available for a wear leveling move. The blocks in this list are not currently mapped to SPA blocks and are therefore available to receive a move from a block that is currently mapped to an SPA block. There are different ways to pick a block that is to receive a move. In some implementations, it may be desired to pick the algorithm so that it is decoupled and random relative to the software using the memory and software or workload memory allocation or read/write patterns. It may also be desired to select a technique that covers the entire PCMS address space uniformly, avoiding any potential hotspot creating patterns and biases the selection towards low write-count blocks.

One such approach is for the BIOS (Basic Input/Output System) or a similar startup resource to randomize the SPA to PDA mapping and use this to initialize the AIT and the PDT. After this initial randomizing, the entries for the Free Wear Level Block List can be picked by sequentially walking through the entire PDA address space excluding only the free blocks and the bad blocks.

Block 105 is a Target Wear Level Block List (TWLBL) in the wear level logic. This list contains descriptors of PDA blocks to be used to create new free blocks as the free block list 104 starts running low. The blocks in this list are still assigned to SPA blocks. After a block on this list is copied to another block in a wear level move, then the block is moved to the Unused Block List.

Block 106 is an Unused Block List (UBL) in the wear level logic. This list contains descriptors of PDA blocks that are not currently being used. The blocks may be blocks that have never been used because the system has not yet needed them. Typically most or all of the blocks will be blocks that were recently holding SPA blocks that were then wear level moved to another block. In other words, this queue contains a list of the blocks that previously were mapped into the system memory space but then that system memory space was moved to another physical block, leaving this physical block unused. These blocks are now ready to become new free blocks or to receive data from other blocks that are to become free blocks based on the free block selection process.

In addition to the various queues, the diagram of FIG. 2 shows the wear level logic as operating using state machines. In the described example, there are three parts to wear leveling. More or fewer parts may be used depending on the particular implementation. These three parts are described herein as Wear Level Move, Free Block List Expansion, and Target Free Block Selection.

In one embodiment, the wear leveling is initiated during system configuration. During memory configuration, the BIOS or another memory configuration agent sets aside a set of PDA blocks for use as free blocks for wear leveling purposes. This is the initial set of blocks that make up the free block list. As the wear leveling proceeds, blocks are continuously used and added to the free block list to maintain some constant number of free blocks on average. The free blocks are accordingly, subtracted from the total block count available to the system software. The blocks that are not set aside are assigned to MCA (Memory Channel Address) blocks. MCA is derived from SPA for each PCMS Controller. This initial MCA to PDA assignment can use a variety of different mapping schemes. In one example, it uses a randomized mapping scheme.

FIG. 2 shows a Wear Level Move State Machine 201 as part of the wear level logic 200. This state machine takes an entry from the Pending Queue 103 and moves it to a PDA block taken from the Free Block List 104. When this is completed, it will update the AIT 101 to show the new map between SPA and PDA. It will put the previously used PDA block into the Unused Block List 106. The PDT 102 is also updated with the correct reverse map.

As shown in FIG. 2, the Wear Level Move State Machine is coupled to each of the queues and lists and also to the Address Control Logic 110. Through the Address Control Logic, the Wear Level State Machine can reach the AIT and the PDT. In the illustrated example, the AIT is reached through a DRAM (Dynamic Random Access Memory) Controller 212 that includes an AIT cache 214 for recently used AIT values. The DRAM Controller is coupled through a DRAM memory channel bus to the AIT which resides off-die in an external location (not shown).

Since each wear leveling move removes an entry from the Free Block List, a Free Block List Expansion takes place periodically to keep the Free Wear Level Block List filled. The threshold for triggering the expansion may be selected to suit a particular application. The Free Block List Expansion State Machine 202 takes an entry from the Target Block List 105 and moves its contents to an entry from the Unused Block List 106. It will then move the Target Block List entry into the Free Block List 104. Through the Address Control Logic, to which it is connected, it will then update the AIT 101 and PDT 102 appropriately.

The Target Free Block Generation State Machine 203 selects the next block for the Free Block List Expansion State Machine to use. A list of such blocks is maintained in the memory controller, for example, in the wear level logic or in the address indirection unit. The Target Free Block Generation State Machine will use a particular technique to pick the next PDA block that is destined to enter the Target Free Block List 104. This technique may be selected based on a variety of different criteria. Two criteria are to cover all of the PDA space in its selection process and to decouple any association between system software and its use of a particular SPA address space. In other words, for the first criterion, the technique spreads wear over the entire memory array and not just some portion. This helps to ensure that the whole array wears out at about the same time. The second criterion prevents software running on the computing system from determining the PDA addresses to be used. Some software program will be written to use specific addresses. This will cause the memory cells corresponding to those particular addresses to wear out more quickly. By changing the address space the physical address designated by the software will be changed over time to different actual physical memory cells, leveling the wear.

Different techniques to pick the next PDA block can be selected depending on the needs of a particular design for a particular application. As with the random shuffling of sub-blocks within a block, the accuracy and precision of the technique can be balanced against its complexity and the latency that it might introduce. Similar techniques can be used as are used for shuffling sub-block including a patterned walk, a random walk, a startup list, a random shuffle, sequential rotation, etc.

The AIT Cache 214 assists in the operation of the AIT 101. Since the AIT is a very large table and is in the critical timing path for each transaction, an AIT cache may be kept in SRAM, DRAM, or some other type of memory, within a PCMS controller to provide very fast access to the SPA to PDA mapping table stored in the AIT. In one example, when a write transaction is received by the PCMS controller, the write transaction will include an address in the SPA. The controller uses the SPA address to look up an entry in the AIT to determine the corresponding PDA block address. The write controller will also increment a Write Count saved in the accessed AIT entry. If the Write Count hits a certain predetermined value, the entry is added to the Pending Queue 103. If not, the AIT entry is simply updated with the new Write Count and the write proceeds as normal to memory array 122, such as a PCMS.

Note that the granularity of writes to the PCMS is much smaller than the wear level block. In this embodiment, the sub-block is 64 Bytes and the wear level block is 4 KiloBytes. This trade-off provides for an efficient write bandwidth use into the PCMS while keeping the AIT a reasonable size (entries for each 4 KB block). However, other sizes may be selected for the write and wear-leveling granularity to suit different implementations.

Figure 3A:
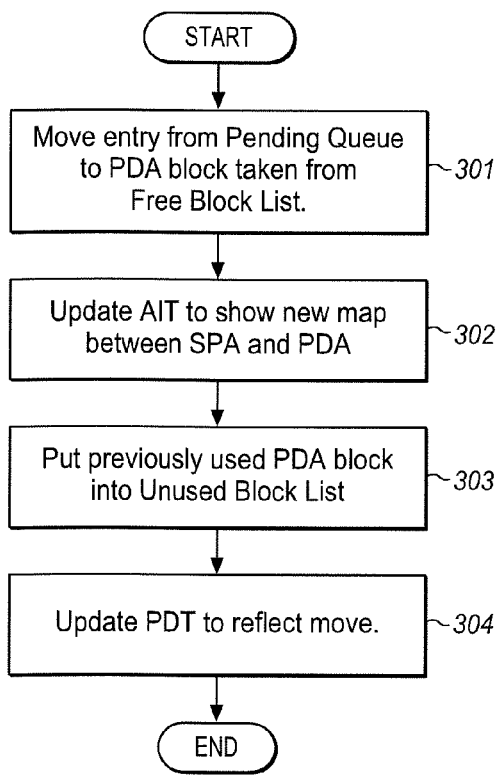
FIG. 3A is a process flow diagram of wear leveling with an Address Indirection Unit according to an embodiment of the invention.

FIG. 3A shows the operations described above in terms of a process flow diagram. The process begins at block 301. The Wear Level Move State Machine 201 takes an entry from the Pending Queue 103 and moves it to a PDA block taken from the Free Block List 104.

Before this move occurs, there may be some preparations that make this operation possible or more efficient, depending on the implementation. Earlier, a write request instruction will be executed and will invoke the memory controller, the address indirection logic, or the wear leveling system to read the AIT in order to find the appropriate physical address corresponding to the logical address of the write request. The write request is executed, for example, by writing data into a PCMS write buffer 118, from which it will be written into the PCMS 122 in the regular course of operations.

Upon reading the AIT, the system will check the AIT Write-Count value. This value may be stored in the AIT or in another location. If this value is greater than a low threshold, then the system can post a move request in the Pending Queue 103. At the same time, the Write Count value may be updated, depending on the particular embodiment. In addition, a Wear Level pending bit can be set in the AIT. This will indicate that a wear leveling move is pending for the corresponding block of physical memory.

Before starting an actual move, the Wear Level Move State Machine picks a wear level request from the Pending Queue and enters this into an Active Wear Level Move Entry (AWLM) The AWLM entry is the context associated with a currently active wear leveling move operation. The AWLM entry remains valid until the completion of the corresponding wear leveling move and the associated state updates.

In one embodiment, the AWLM can include a valid/invalid entry to indicate whether a wear leveling move is in progress, a source address indicating the block from which the data is to be moved, and a destination address indicating the destination block to which the data from the source block will be moved. The AWLM entry may be cleared, or set to invalid, after the corresponding wear leveling move is completed.

In one embodiment, after the AWLM entry is set to valid, then any future write operations to that block of the memory can be held in a buffer until after the wear leveling move is completed. The instruction can be held or the write can be performed to a write buffer from which it will be written to the PCMS after the move. After the wear leveling move is finished, then the pending write operations will be sent to the new target block. By associating the AWLM with the AIT, any write operation that looks into the AIT to map the write request to physical memory can, at the same time, discover that a wear leveling move is in progress for the particular block.

In order to begin the wear leveling move, the Wear Level Move State Machine picks a free block from the Free Block List, reads the PCMS block to be moved and moves the data from the physical memory of the source block into a buffer. Any entries in the write buffer waiting to go to the physical memory may also be gathered into the write buffer. Alternatively, these may be left in the write buffer for execution after the move is completed. The Wear Level State Machine may then write the data that was in the source block from the move buffer into the destination block. Upon completion of the wear leveling move, the AWLM entry can be cleared or set to invalid.

At block 302, the Wear Level Move State Machine updates the AIT to show a new map between SPA and PDA. This will reflect the change in the mapping from mapping to the source block to mapping to the destination block. The AIT is also updated to refresh the Write Count, and clear the list of pending write operations, if any. At block 303, it will put the previously used PDA block into the Unused Block List and at block 304 it will update the PDT also to reflect the move. After the move the write count for the previously used PDA block can be deleted or overwritten with a default or random value. There is no need to track the write count for the unused blocks. This increases the system's robustness through power cycling and catastrophic events.

In order to support the wear level moves, the Free Block List is expanded to continually add new blocks. These are the blocks consumed by a wear leveling move when a block is moved to a block in the Free Wear Level Block List. The Free Block List Expansion State Machine takes blocks from the Unused Block List and moves them to the Free Wear Level Block List so that they can become destination blocks in a wear leveling move.

Figure 3B:
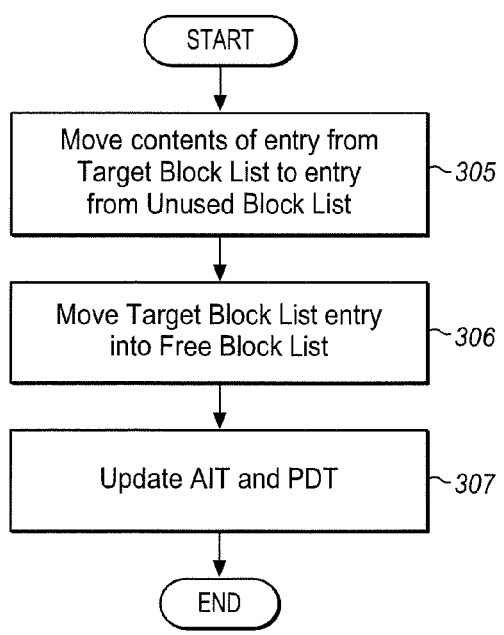
FIG. 3B is a process flow diagram of wear leveling with a Free Block List according to an embodiment of the invention.

Referring to the flow process of FIG. 3B, at block 305, the Free Block List Expansion State Machine 202 takes an entry from the Target Block List 105 and moves its contents to an entry from the Unused Block List. 106. This move may involve many of the operations mentioned above for the Wear Level Move State Machine including setting the Wear Level Pending bit, moving data into a write buffer, gathering any pending write operations, and then clearing the pending bit when the move is completed. The block from the Unused Block List is the destination block in this case and is removed from the Unused Block List before or after the move. The block from the Target Block List is the source block and it is moved to the Free Block List.

At block 306, the Free Block List Expansion State Machine moves the Target Block List 105 entry into the Free Block List 104. In other words, the block from the Target Block List is now empty and can be moved to the Free Block List. At block 307, the state machine will then update the AIT and PDT appropriately.

The free block list expansion consumes blocks from the Target Block List so the Target Free Block Generation State Machine replenishes the Target Block List.

Figure 3C:
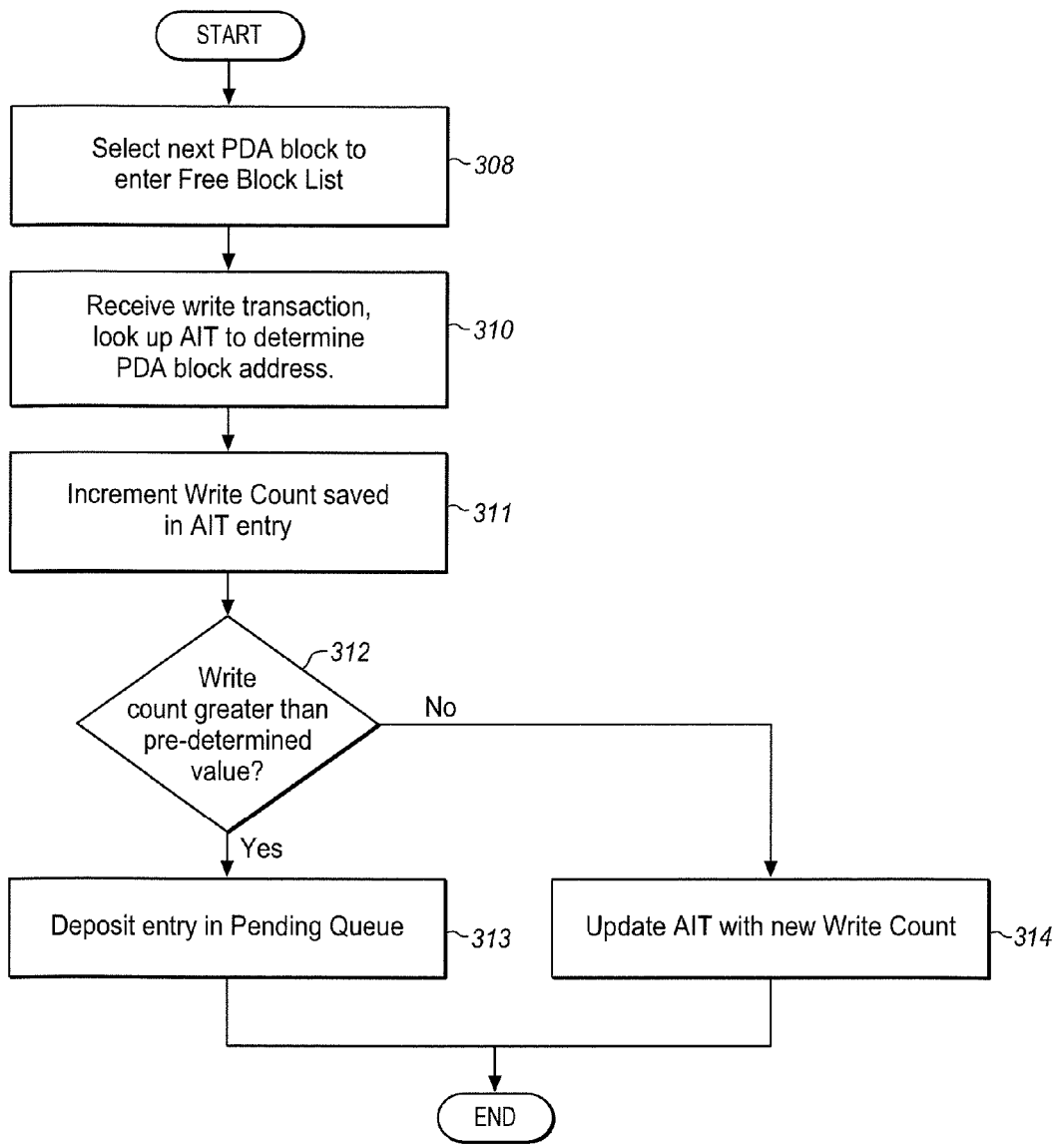
FIG. 3C is a process flow diagram of wear leveling using write counts in an Address Indirection Table according to an embodiment of the invention.

Referring to FIG. 3C, at block 308, the Target Free Block Generation State Machine 203 picks the next PDA block that is to enter the Free Block List. The selection can be done in a variety of different ways depending on the particular implementation. This may include a random walk, a check of wear level count values, etc. In one embodiment, the state machine selects the next block that is not identified as a bad block.

At block 310, when a write transaction is received by the PCMS controller, it looks up the system address (SPA) in the AIT to determine the PDA block address. At block 311, it will increment the Write Count saved in the AIT entry. At block 312, if the Write Count hits a certain pre-determined value, the entry is deposited in the Pending Queue at block 313. If not, then the AIT is simply updated with the new Write Count at block 314 and the write proceeds as normal to PCMS.

FIGS. 4A through 4B represent the movement of data from one block to another among the blocks of memory cells in a memory array, for example, a PCMS array. In FIGS. 4A to 4D, the free blocks F represent free PDA blocks. The SPA blocks 1-16 represent PDA blocks that are currently assigned to SPA blocks. In other words, the assigned PDA blocks are currently being used to store data.

FIG. 4A shows a stable state in which the first set of blocks, labeled F, are available or free and a second state of blocks labeled 1-16 are in use. The F blocks are listed in the Free Block List 104 and blocks 1-16 are indicated in the AIT 101 and PDT 102.

In FIG. 4B, SPA Block 8, for example, becomes "hot" due to a large total number of writes to it. It is then placed in the pending queue and will, accordingly, be scheduled for a Wear Level Move. In FIG. 4C, the Wear Level Move State Machine copies the hot block 8 to the first available free block, the F block at the top of the diagram The former block 8 becomes an unused block, indicated by U. This block will be added to the Unused Block List 106.

After this move, the Target Free Block state machine 203, picks the next available PDA block as the next free block. As indicated in FIG. 4C, the next free block is identified as block 1. The free blocks are indicated in the Free Block List 104. After the next free block is identified, the Free Block Expansion state machine 202 moves the current contents of the target free block, indicated as block 1 in FIG. 4C to the unused block indicated as U in FIG. 4C. It then adds an identifier of the target free block in the Target Block List 105. This condition is shown in FIG. 4D in which there are four free block F, however, the former first used block, 1, is not a free block F and the contents formerly in block 1 have been moved to the former block 8.

The technique described above helps to provide that the free blocks slowly move through the entire PDA space and that the identity of the free blocks is decoupled from the software generated SPA addresses.

The process flow described above uses Pending Queue 103 from which the Wear Level Move State Machine 201 selects blocks for a wear leveling move. The blocks can be selected using a first-in-first-out approach or using some sort of pattern or random selection. In one embodiment, all of the blocks in the Pending Queue are ready for a move and it is not important which ones to move first provided that the number of blocks in the queue does not become too large.

The process flow described above also uses an Unused Block List 106, a Target Block List 105, and a Free Block List 104. The Unused Block List is used to allow blocks to be moved from the Target Block List to the Free Block List. The Free Block List is used to allow blocks in use with a high write count (in the Pending Queue) to be moved to the Unused Block List. Considered another way, the Wear Level Move State Machine moves data to blocks in the Free Block List, while the Free Expansion State Machine moves data from blocks in the Target Block List to blocks of the Unused Block List.

As a result there are two simultaneous moving processes occurring simultaneously. The wear leveling process takes blocks from the Pending Queue and moves them to the Unused Block List. To do this it also takes blocks from the Free Block List and puts them into use where they may eventually return to the Pending Queue. The free block list expansion process takes blocks from the Target Block List and moves them to the Free Block List. To do this it also takes blocks from the Unused Block list puts them into use where they may eventually return to the Pending Queue. The Pending Queue from which the wear leveling draws ties these two processes and the three block lists together so that blocks can move from one process to the other.

The two simultaneous moving processes rely on different selection criteria for their operation. The wear leveling process relies on the write count. Blocks are placed in the pending queue based on the write count. The free block list expansion process, however, does not use the write count. This eliminates any need to track write counts for unused and free blocks. As mentioned above, it can use a wide range of different techniques to fill the target free block list. The second process adds a mixing of sorts to the use of the physical address blocks that improves the integrity of the wear leveling system. The second process also reduces the predictability of the system. This makes the system harder to attack by an outsider. The second process by adding another factor to the overall use of the memory blocks helps to ensure that all blocks are used and that the wear leveling is applied across the entire physical memory regardless of the system addresses that might be invoked by particular software or BIOS programs.

As mentioned above, the target blocks can be selected using a walk through the physical addresses, a patterned walk, or a random walk can be used. The target blocks can also be selected based on a list generated during startup. Additional alternatives include a random shuffle using a static seed, sequential rotation, applying an XOR to address bits with a random number, applying an XOR to PDA address bits with SPA address bits, etc.

In one embodiment, the second process, the free block list expansion process, the Target Block List, and the Free Block List are not used. Instead, the Wear Level State Machine takes blocks from the Pending Queue, moves content from those blocks into a block selected from the Unused Block List and, after the move, assigns the first block to the Unused Block List. In such an embodiment, the selection of blocks from the Unused Block List can be done using the processes described above the selecting target blocks.

In another embodiment, the first process, the wear leveling process, the unused block list and the pending queue are not used. The free block expansion process takes blocks from the target free block list, moves the content to a block selected from the free block list and, after the move, assigns the first block to the free block list. The selection of blocks from the free block list can be done as described above for selecting target blocks. While in this embodiment, wear leveling is not addressed directly, it will be addressed indirectly by remapping the address translation after each move.

Many other variations can be made to the examples described herein by removing and adding data structures, state machines, and operations to the embodiment described herein. The operations can also be moved to different hardware components and to different locations to suit particular applications. Both of the simplified single process embodiments described above can be enhanced by randomizing additional elements of the system. For example, the AIT can be randomized initially or periodically for free or unused blocks. The mapping of sub-blocks within the AIT can be randomized initially and each time the AIT is updated after a move. Similarly, the write counts can be randomized. In addition to a random initialization, current values can be randomized at intervals using an addition or replacement or other operations. Many of the other parameters of the system can also be similarly manipulated to spread operations throughout the memory array and to change the timing of operations.

Figure 5:
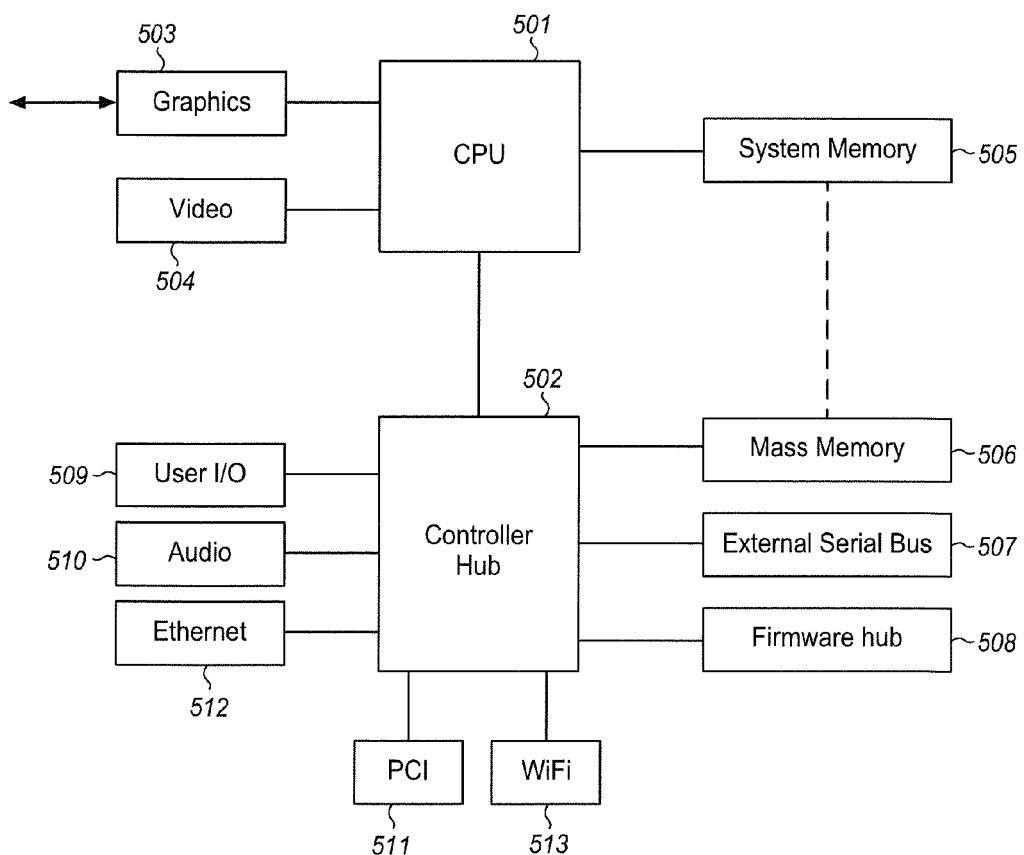
FIG. 5 is block diagram of a computer system with wear leveling applied to its memory systems according to an embodiment of the invention.

FIG. 5 shows an example of a system to which embodiments of the present invention may be applied. A Central Processing Unit (CPU) 501 is coupled to a controller hub 502 or south bridge 502. The CPU includes a memory controller and is coupled directly to system memory 505, typically in the form of DRAM, but in the examples described above, this memory may be a non-volatile memory, such as PCMS. The CPU is also coupled to a peripheral graphics bus 503 for use by one or more video cards and may also provide video directly from a video port 504 to a display.

The controller hub 502 also has a memory controller interface to mass memory 506 such as magnetic disk, flash-based memory or other memory types, including PCMS. In one embodiment, the mass memory is coupled directly to the system memory (shown in dotted line) or to the CPU and does not connect to the controller hub. In another embodiment both the system memory and the mass memory are coupled to the CPU through the controller hub on different buses or though the same bus. An address indirection unit may be incorporated into the CPU, the controller hub, or the memory array.

The controller hub is also connected to a number of other devices, depending upon the intended use of the computer system. In the illustrated system, the controller hub is also coupled to an external serial bus 507, such as one or more of USB (Universal Serial Bus), Firewire, Thunderbolt, or DisplayPort. The controller hub is also coupled to a firmware hub 508 to permit connections to system devices (not shown). User I/O devices 509 and Audio I/O 510 are also coupled to the controller hub. Video may also be supported, together with peripheral component buses 511. Network interfaces, such as Ethernet 512, WiFi, 513 or cellular data may also be supported by independent connection to the controller hub or through connection to one or more of the other buses shown in the diagram.

Embodiments of the present invention may be used as an integral part of a PCMS controller in a microcomputer architecture, or for a hierarchical server memory subsystem using PCMS as the bulk memory, for other uses. In the described example, the technique optimizes performance and PCMS wear-out and hence provides a uniquely valuable solution for server platforms. Among other applications, it can be used with any PCMS based memory subsystem that uses a DRAM based Address Indirection Table. The described technique allows, for example, for direct 64 B writes into PCMS.

It is to be appreciated that a lesser or more equipped system than the example described above may be preferred for certain implementations. Therefore, the configuration of the exemplary systems will vary from implementation to implementation depending upon numerous factors, such as price constraints, performance requirements, technological improvements, or other circumstances.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method comprising:
assigning a system memory address to physical memory address of a first block of physical memory;
counting an indication of a number of write operations to the first block of physical memory; the first block storing data from the write operations;
comparing the counted indication to a threshold;
if the counted number of write operations exceeds the threshold, then selecting a second block of physical memory;
performing a wear leveling move of data stored in the first block to the selected second block by writing the contents of the first block to a write buffer, gathering pending write operations for the first block into the write buffer, and writing the contents of the write buffer to the second block;

assigning the system memory address to the second block; and assigning the first block to a pool of unused blocks of physical memory.

2. The method of claim 1, wherein selecting a second block comprises selecting the second block from the pool of unused blocks.

3. The method of claim 1, wherein selecting a second block comprises selecting the second block from a pool of free blocks.

4. The method of claim 3, further comprising selecting, as blocks for the pool of free blocks, blocks from among blocks assigned to a system memory address and moving the contents to a block from the pool of unused blocks.

5. The method of claim 4, wherein selecting the blocks from among blocks assigned to a system memory address comprises selecting blocks using a random walk.

6. The method of claim 1, further comprising assigning the first block to a pending queue of blocks awaiting a wear leveling move and selecting the first block from the pending queue.

7. The method of claim 1, wherein assigning the first block to the pool of free blocks comprises assigning the first block to a pool of unused blocks.

8. The method of claim 1, wherein performing a wear leveling move further comprises setting a bit associated with an address indirection table to indicate that system memory address is not available for write operations.

9. The method of claim 8, further comprising setting the bit before performing the wear leveling move and clearing the bit after performing the wear leveling move.

10. The method of claim 9, wherein setting the bit causes incoming instructions to read or write from the system memory address to be buffered until the bit is cleared.

11. The method of claim 1, further comprising selecting the write count threshold based on a desired amount of wear leveling.

12. The method of claim 1, further comprising resetting the counted number of write operations of the first block of physical memory after assigning the first block to the pool of unused blocks.

13. A method comprising:
mapping a set of system memory addresses to physical memory addresses of a first block of physical memory, the mapping shuffling the mapping of sub-blocks of system memory addresses to sub-blocks of the first block;
initializing a write count value for the first block;
incrementing the write count value upon writing to the physical memory addresses of the first block;
if the write count value exceeds a threshold, then selecting a second block of physical memory;
performing a wear leveling move of data stored in the first block to the selected second block by writing the contents of the first block to a write buffer, gathering pending write operations for the first block into the write buffer, and writing the contents of the write buffer to the second block;
assigning the system memory address to the physical memory addresses of the second block; and
assigning the first block to a pool of unused blocks of physical memory.

14. The method of claim 13, wherein the shuffling comprises random shuffling.

15. The method of claim 13, wherein initializing a write count comprises assigning a random value as the write count.

16. The method of claim 13, wherein initializing a write count comprises setting the write count to zero.

17. An apparatus to level wear in a memory array comprising:
an address indirection table to translate system physical addresses from a software system to physical device addresses of the memory array;
a write count register to store an indication of a number of write operations to each block of memory of the memory array, the cells of the memory array being divided into a plurality of blocks;
address control logic to compare a stored write count to a threshold; and
wear level logic to perform a wear leveling move of data stored in a first block for which the stored write count exceeds the threshold by writing the contents of the first block to a write buffer, gathering pending write operations for the first block into the write buffer, and writing the contents of the write buffer to the second block, the second block being selected from a pool of free blocks and to update the address indirection table to reflect the wear leveling move.

18. The apparatus of claim 17, wherein the wear level logic selects the second block from a pool of free blocks and selects, as blocks for the pool of free blocks, blocks from among blocks assigned to a system memory address and moves the contents of the first block to a block from the pool of unused blocks.

19. The apparatus of claim 17, wherein the wear level logic initiates the write count register to a random value after performing the wear leveling move.

20. An apparatus to level wear in a memory array comprising:
a wear level move state machine to select a first block as an active block based on a wear criteria, to move the contents of the selected first active block to a selected second block from a free block list, and to move the selected first active block to an unused block list, the move from the first block to the selected second block being by writing the contents of the first block to a write buffer, gathering pending write operations for the first block into the write buffer, and writing the contents of the write buffer to the second block;
a free block list expansion state machine to take a selected third block from a target free block list, to move the contents of the selected third block to a selected fourth block from the unused block list, and to move the third block taken from the target block list to a free block list; and
a target free block generation state machine to select multiple blocks from the unused block list and to move the selected multiple blocks to the target free block list.

21. The apparatus of claim 20, wherein the wear level move state machine is further to update an address indirection table to reflect the move of contents from the selected first active block, and wherein the free block list expansion state machine is further to update the address indirection table to reflect the move of contents from the selected third block taken from the target free block list.

22. The apparatus of claim 21, wherein the target free block generation state machine selects the multiple blocks using a wear balancing technique.

* * * * *